US012795973B2

(12) United States Patent
Hoffmann

(10) Patent No.: US 12,795,973 B2
(45) Date of Patent: Nov. 10, 2026

(54) FIELD-EFFECT TRANSISTOR WITH A DIELECTRIC STRUCTURE HAVING A GATE DIELECTRIC AND A SHIELDING DIELECTRIC

(71) Applicant: Infineon Technologies AG, Neubiberg (DE)

(72) Inventor: Andreas Hoffmann, Munich (DE)

(73) Assignee: Infineon Technologies AG, Neubiberg (DE)

(*) Notice: Subject to any disclaimer, the term of this patent is extended or adjusted under 35 U.S.C. 154(b) by 427 days.

(21) Appl. No.: 18/487,170

(22) Filed: Oct. 16, 2023

(65) Prior Publication Data

US 2024/0145580 A1 May 2, 2024

(30) Foreign Application Priority Data

Oct. 27, 2022 (DE) ......................... 102022128549.9

(51) Int. Cl.

| | |
|---|---|
| ***H01L 29/66*** | (2006.01) |
| ***H01L 29/10*** | (2006.01) |
| ***H01L 29/78*** | (2006.01) |
| ***H10D 30/01*** | (2025.01) |
| ***H10D 30/60*** | (2025.01) |
| ***H10D 62/17*** | (2025.01) |

(52) U.S. Cl.

CPC ....... *H10D 30/0281* (2025.01); *H10D 30/601* (2025.01); *H10D 62/314* (2025.01)

(58) Field of Classification Search

CPC ........... H10D 30/0221; H10D 30/0275; H10D 30/0281; H10D 30/601; H10D 30/603; H10D 30/65; H10D 62/314

See application file for complete search history.

(56) References Cited

U.S. PATENT DOCUMENTS

| | | | | |
|---|---|---|---|---|
| 5,923,055 | A | 7/1999 | Schlangenotto et al. | |
| 2004/0222461 | A1* | 11/2004 | Peyre-Lavigne .... | H10D 62/111 257/E29.256 |
| 2006/0091503 | A1* | 5/2006 | Wu ...................... | H10D 30/603 257/E29.268 |
| 2009/0194785 | A1 | 8/2009 | Lu et al. | |
| 2017/0141213 | A1* | 5/2017 | Ryu ................... | H10D 30/0221 |
| 2019/0131390 | A1* | 5/2019 | Huang ............... | H10D 30/0285 |
| 2019/0165096 | A1* | 5/2019 | Kao ..................... | H10D 30/601 |

* cited by examiner

*Primary Examiner* — David C Spalla

(74) *Attorney, Agent, or Firm* — Murphy, Bilak & Homiller, PLLC

(57) ABSTRACT

A field-effect transistor (FET) is described. The FET has a dielectric structure which includes a gate dielectric and a shielding dielectric. The shielding dielectric is thicker than the gate dielectric and adjoins or is spaced apart from the gate dielectric along a first lateral direction. A channel region of a first conductivity type adjoins a lower side of the gate dielectric. An auxiliary region of a second conductivity type adjoins the lower side of the gate dielectric and adjoins the channel region along a second lateral direction.

23 Claims, 4 Drawing Sheets

FIELD-EFFECT TRANSISTOR WITH A DIELECTRIC STRUCTURE HAVING A GATE DIELECTRIC AND A SHIELDING DIELECTRIC

TECHNICAL FIELD

The present disclosure relates to a semiconductor component, in particular to a field-effect transistor (FET).

BACKGROUND

The technological development of new generations of semiconductor components, for example FETs, is aimed at improving the electrical properties of the components and lowering the manufacturing costs by reducing the component dimensions. Although the costs may be lowered by reducing the component dimensions, a range of compromises and challenges must be tackled for this purpose, in order to increase the component functionality per unit area. For example, a compromise needs to be found between the area-specific on-state resistance, $R_{on}$xA, switching efficiency and reliability requirements.

There is therefore a need for an improved field-effect transistor.

SUMMARY

One example of this disclosure relates to a field-effect transistor, FET. The FET has a dielectric structure, which comprises a gate dielectric and a shielding dielectric. The shielding dielectric is thicker than the gate dielectric and adjoins or is spaced apart from the gate dielectric along a first lateral direction. The FET furthermore has a channel region of a first conductivity type, which adjoins a lower side of the gate dielectric. The FET furthermore has an auxiliary region of a second conductivity type, which adjoins the lower side of the gate dielectric and adjoins the channel region along a second lateral direction. The FET may also have a drain extension region of the first conductivity type, which adjoins a lower side of the shielding dielectric.

Another example relates to a method for forming a field-effect transistor, FET. The method includes forming a dielectric structure, which has a gate dielectric and a shielding dielectric, the shielding dielectric being thicker than the gate dielectric and adjoining or being spaced apart from the gate dielectric along a first lateral direction. The method includes forming a channel region of a first conductivity type, which adjoins a lower side of the gate dielectric. The method furthermore includes forming an auxiliary region of a second conductivity type, which adjoins the lower side of the gate dielectric and adjoins the channel region along a second lateral direction. The method may also include forming a drain extension region of the first conductivity type, which adjoins a lower side of the shielding dielectric.

A person skilled in the art will identify additional features and advantages on reading the following detailed description and studying the appended drawings.

BRIEF DESCRIPTION OF THE DRAWINGS

The figures illustrate examples of field-effect transistors and integrated circuits and, together with the description, serve to explain principles of the examples. Further examples are explained in the following detailed description.

DETAILED DESCRIPTION

Figure 1A:
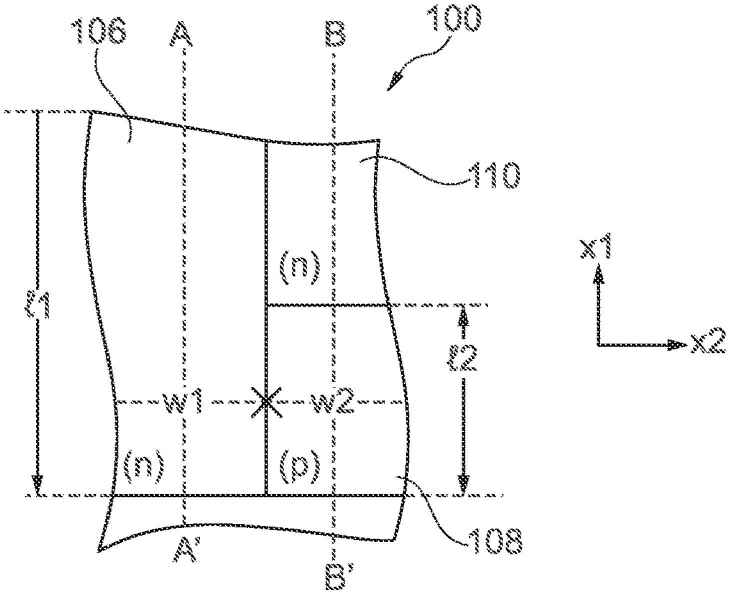
FIGS. 1A to 1C show an exemplary field-effect transistor of the depletion type in plan and cross-sectional views.

The following detailed description makes reference to the drawings, which illustrate exemplary configurations of FETs. Features which are represented or described for one example may be used in conjunction with other examples in order to obtain a further example. The present disclosure is explicitly intended to comprise such modifications and variations. The drawings are not true to scale and serve merely for illustration.

The terms "have", "comprise", "contain" and the like are open terms and indicate the presence of the specified structures, elements or features but do not exclude the presence of additional elements or features.

The term "electrically connected" may denote a permanent low-ohmic connection between electrically connected elements, for example a direct contact between the relevant elements or a low-ohmic connection via a metal and/or a heavily doped semiconductor material. The term "electrically coupled" may involve the possibility of one or more intermediate elements for signal and/or power transmission, for example elements which are controllable in order to establish a low-ohmic electrical connection in a first state and high-ohmic electrical decoupling in a second state, being connected between the electrically coupled elements.

The ranges indicated for physical quantities include the limit values. For example, a range of from a to b for a parameter y means $a \leq y \leq b$. The same applies for ranges with a limit value such as "at most" and "at least".

The terms "on" and "over" are not to be interpreted as meaning only "directly on" and "directly over". Rather, if one element lies "on" or "over" another element (for example a layer "on" or "over" another layer or "on" or "over" a substrate) a further entity (for example a further layer) may lie between the two elements (for example, a further layer may lie between a layer and a substrate if the layer lies "on" or "over" the substrate).

An FET according to one exemplary embodiment has a dielectric structure. The dielectric structure may comprise a gate dielectric and a shielding dielectric. The shielding dielectric is, for example, thicker than the gate dielectric and adjoins or is spaced apart from the gate dielectric along a first lateral direction. The FET additionally has for example a channel region of a first conductivity type, which adjoins a lower side of the gate dielectric. The FET additionally has for example an auxiliary region of a second conductivity type, which adjoins the lower side of the gate dielectric and adjoins the channel region along a second lateral direction. The FET also has for example a drain extension region of the first conductivity type, which adjoins a lower side of the shielding dielectric.

The FET may, for example, be a lateral FET. In a lateral FET, the load current direction is a lateral direction, for example the first lateral direction, and a source region and a drain region are spaced apart from one another along the first lateral direction. The lateral FET may, for example, be a laterally diffused metal oxide semiconductor transistor (LDMOS transistor). In the LDMOS transistor, a channel region may be defined by a lateral diffusion offset between dopants of the source region and dopants of the body region, which may initially be introduced into a semiconductor body through a common mask, for example by ion implantation. During the production of LDMOS transistors, however, different masks are generally used for the introduction of the dopants for the source region and the dopants for the body region. The channel region of the LDMOS transistor may therefore also be defined by lithography.

The FET may, for example, be a planar FET. Unlike in trench FETs, in which the gate electrode is arranged in a trench and a channel current flows along a side wall of the trench, the gate electrode in the planar FET is planar, or flat, and is arranged over the first surface of the semiconductor body. The channel current therefore flows along the first surface in a channel region which adjoins the gate dielectric on the first surface.

The FET may, for example, be produced monolithically in a hybrid technology. Such hybrid technologies are used, for instance, in order to form analog circuit units in a chip by the bipolar components contained in this technology and in order to provide interfaces to digital systems, and in order to form digital circuit units by the complementary metal oxide semiconductor (CMOS) components contained in this technology and to provide a signal processing functionality, as well as to form low, medium or high-voltage or power units by field-effect transistors contained in this technology. Such hybrid technologies are known for example as bipolar CMOS-DMOS, BCD technologies or smart-power technologies (SPT), and are used in many application fields, for example in illumination technology, engine control, automobile electronics, energy management for mobile devices, audio amplifiers, current supply, in hard drives and printers. The FET may, for example, be part of a BCD or smart-power chip in one of the aforementioned application fields.

The semiconductor body containing the FET may be based on various semiconductor materials, for example silicon (Si), silicon on insulator (SOI), silicon on sapphire (SOS), silicon-germanium, germanium, gallium arsenide, silicon carbide, gallium nitride or other compound semiconductor materials. The semiconductor body may be based on a semiconductor substrate, for example a semiconductor wafer, and contain one or more epitaxial layers deposited thereon, and it may also be thinned on the rear side.

The gate dielectric may, for example, be formed on a first surface of the semiconductor body. The first surface may be a front side or an upper side of the semiconductor body, and a second surface may for example be a rear side or a backside of the semiconductor body. The semiconductor body may, for example, be fastened on a lead frame by the second face. Over the first surface of the semiconductor body, bond pads may be arranged and bond wires may be bonded, for example to the bond pads.

The FET may have a source electrode and a drain electrode as part of an interconnection area over the semiconductor body. The interconnection area may comprise one or more than one, for example, two, three, four or even more interconnection levels. Each interconnection level may consist of one individual conductive layer or a stack of conductive layers, for example metal layers or heavily doped semiconductor layers. The interconnection levels may, for example, be lithographically structured. A dielectric interlayer structure may be arranged between the stacked interconnection levels. Contact plugs or vias may be formed in openings in the dielectric interlayer structure in order to electrically connect parts, for example metal lines or contact areas, of different interconnection levels to one another. The source electrode may be formed from one or more elements of the interconnection area. The drain electrode may likewise be formed from one or more elements of the interconnection area. For example, the source electrode and the drain electrode may comprise separate parts of a structured first interconnection level, for example of a first metal layer.

The dielectric structure may comprise a multiplicity of parts which are mutually adjacent or merge into one another or are coherent, which may differ for example in material, shape and/or function. For example, the coherent parts of the dielectric structure may be formed by separate processes. The coherent parts of the dielectric structure may, for example, be parts which are coherent along the first lateral direction. The gate dielectric may for example be an electrically insulating material such as an oxide, for example $SiO_2$, a nitride, for example $Si_3N_4$, a high-k dielectric or a low-k dielectric, or any combination thereof. For example, the gate dielectric may be formed as a thermal oxide. The dielectric structure may, for example, comprise further parts in the direction of the drain electrode, which differ from the gate dielectric in relation to the material composition or the geometrical dimensions, such as the thickness. One example of such a further part of the dielectric structure is the shielding dielectric, which is thicker than the gate dielectric and adjoins the gate dielectric along the first lateral direction or is spaced apart from the gate dielectric, for example by a further part of the dielectric structure which is arranged between them. For example, the thickness of the shielding dielectric may exceed the thickness of the gate dielectric by from 100% to 600%. In some other examples, the thickness of the shielding dielectric may actually exceed the thickness of the gate dielectric by 700% or even more. For example, the thickness of the shielding dielectric may exceed the thickness of the gate dielectric by 10 nm or more.

A lower side of the shielding dielectric may have a smaller vertical distance from the second surface, for example the rear side of the component, than the first surface. For example, the lower side of the shielding dielectric may be located on the lower side of a recess or trench in the semiconductor body. In this case, the shielding dielectric may be formed as a shallow trench isolation (STI). The lower side of the shielding dielectric may also correspond to the lower side of an oxidized part of the semiconductor body, for example the lower side of a local oxidation of silicon (LOCOS).

For example, a dielectric interlayer structure as a further part of the dielectric structure may be arranged on the shielding dielectric. The first interconnection level may be an interconnection level of the interconnection area, this level being the one closest to the first surface of the semiconductor body. The first interconnection level may contain separate parts, for example separate metal layer sections. The separate parts may for example comprise parts of a field electrode, of a source electrode or of a drain electrode.

The gate electrode may consist of one or more conductive materials, for example of metal, metal silicide, a metal compound, heavily doped semiconductor material such as heavily doped polycrystalline silicon. The gate electrode may for example consist of a single layer, for example a heavily doped polycrystalline layer, or of a layer stack. The gate electrode may be a planar gate electrode which is formed directly on the gate dielectric. For example, the gate electrode may be spaced apart from the shielding dielectric by a lateral distance along the first lateral direction. The gate electrode may, however, also extend along the lateral direction as far as a part of the shielding dielectric. For example, in addition to the gate electrode, the FET may have a field electrode which consists of one or more conductive materials, for example of metal, metal silicide, a metal compound or a heavily doped semiconductor material such as heavily doped polycrystalline silicon. The field electrode may, for example, be configured in terms of shape and/or material similarly to contact plugs or contact lines, or vias, in the interconnection area, which are used to electrically connect an active region in the semiconductor body, for example a transistor cell array of the FET, to an interconnection level in the interconnection area. For example, the field electrode adjoins the shielding dielectric and may be spaced apart from the gate electrode along the first lateral direction. The field electrode may therefore be electrically separated from the gate electrode. The field electrode may, for example, be electrically connected to the source electrode. As an alternative thereto, the field electrode may be electrically connected to a reference voltage. The reference voltage may, for example, be provided by a voltage divider or a reference voltage source.

The auxiliary region of the FET, which adjoins a lower side of the gate dielectric and adjoins the channel region along the second lateral direction, may for example be part of a body structure of a second conductivity type. For example, the body structure and the source region may be electrically short-circuited, for example by being electrically connected to the source electrode. The channel region may, for example, be formed between a part of the body structure and the gate dielectric. The body structure may also have a deep body region, the vertical dopant profile of which decreases toward the first surface and overlaps with a vertical dopant profile of a shallow body region of the body structure, which decreases in an opposite direction. The deep body region may furthermore extend along the first lateral direction to below the drain extension region, or beyond the latter, that is to say the deep body region and the drain extension region may partially overlap along the first lateral direction. The partial overlap may have a positive effect on the blocking capability of the FET because of the compensation principle or the RESURF (REduced SURface Field) principle.

The drain extension region may, for example, adjoin the body structure along the first lateral direction. The drain extension region may also, for example, be designed for a drain-source breakdown voltage in a range of from 5 V to 200 V. The desired reverse voltage region may, for example, be adjusted by suitable dimensioning and doping of the drain extension region. For example, the FET may thus be used in circuit applications such as voltage supply units, for example a logic voltage supply unit with bandgap switching. In order to achieve a desired current-carrying capacity, the FET may be constructed from a multiplicity of FET cells connected in parallel. The parallel-connected FET cells may, for example, be field-effect transistor cells which are configured in the form of a strip or a strip segment. Naturally, the FET cells may also have any other shape, for example circular, elliptical, polygonal, e.g. octahedral.

The combination of a channel region and auxiliary region along the second lateral direction allows an improvement in the reliability of the self-conducting FET. A center of the impact ionization between the body structure and the drain extension region may lead to an accumulation of holes below the gate dielectric, which may interfere with the gate functionality or lead to loss of the gate functionality, for example by potential shifts. The auxiliary region can counteract this undesired accumulation of holes by providing a path for dissipating the holes, and therefore leads, in combination with the channel region, to an improvement in the reliability of the FET.

For example, the FET may be a lateral FET of the depletion type. A FET of the depletion type is self-conducting. A self-conducting FET conducts immediately after an applied voltage between the source and the drain. This is achieved for example by weak n-doping between n-conductive wells (source and drain), for example the channel region. For example, the lateral FET of the depletion type blocks fully only when the gate voltage is more negative than the voltage at the source terminal.

For example, the channel region and the auxiliary region may be arranged alternating along the second lateral direction. Respective widths of the channel regions arranged offset along the second direction may match or vary. A variation of the width of the channel regions may also be restricted to one or more sections along the second lateral direction. Respective widths of the auxiliary regions arranged offset along the second direction may match or vary. A variation of the width of the auxiliary regions may also be restricted to one or more sections along the second lateral direction.

For example, the auxiliary region may be a part of a well region, for example a body or bulk region, of the second conductivity type, which adjoins a lower side of a part of the channel region.

For example, the well region has a first vertical profile of dopants of the second conductivity type, for example boron. A maximum dopant concentration of the first vertical profile may lie in a range of from $10^{17}$ cm$^{-3}$ to $5\times10^{17}$ cm$^{-3}$. A dose of the first vertical profile may, for example, lie in a range of from $1\times10^{12}$ cm$^{-2}$ to $2\times10^{13}$ cm$^{-2}$.

For example, the channel region has a second vertical profile of dopants of the first conductivity type, for example arsenic. A maximum dopant concentration of the second vertical profile may lie in a range of from $10^{17}$ cm$^{-3}$ to $3\times10^{18}$ cm$^{-3}$. A dose of the second vertical profile may, for example, lie in a range of from $5\times10^{11}$ cm$^{-2}$ to $7\times10^{12}$ cm$^{-2}$.

For example, the dopants of the first vertical profile in the channel region may partially compensate for the dopants of the second vertical profile in the channel region. The net doping is therefore determined by the conductivity type of the dopants of the second vertical profile.

For example, the first channel region and the auxiliary region may respectively extend in the form of a strip along the first lateral direction. Depending on the dimensioning of the channel and auxiliary regions arranged alternating in the second lateral direction, an extent of the channel region along the first lateral direction may be greater than, less than or equal to the extent of the respective channel region along the second lateral direction. An extent of an auxiliary region along the first lateral direction may also be greater than, less than or equal to the extent of the respective auxiliary region along the second lateral direction.

For example, a strip width of the channel region along the second lateral direction may be from two to twenty times as great as a strip width of the auxiliary region along the second lateral direction. Suitable dimensioning of the strip widths allows an unimpeded gate functionality without suppressing the accumulation of holes by means of the auxiliary region used for the dissipation of holes, together with a compact design by using the component width for the channel region. For example, the channel region may have a strip width in the range of from 3 μm to 6 μm and the auxiliary region may for example have a strip width in a range of from 0.3 μm to 1 μm, for example a strip width of 0.6 μm in the auxiliary region and a strip width of 4.4 μm in the channel region.

For example, a strip length of the channel region along the first lateral direction may be greater than a strip length of the auxiliary region along the first lateral direction. For example, the channel region and the auxiliary region may end flush in the direction toward the source region and the channel region may protrude beyond the auxiliary region along the first lateral direction in the direction toward the drain region.

For example, a part of the drain extension region may adjoin a lower side of a part of the channel region. The part of the drain extension region may in addition laterally adjoin the body structure.

For example, the channel region and the auxiliary region may be electrically connected by contacts, for example contact plugs, arranged mutually offset along the first lateral direction or along the second lateral direction.

For example, the channel region and the auxiliary region may be electrically connected in common by a contact extending along the second lateral direction. The contact may, for example, extend without interruption beyond the boundary between the channel region and the auxiliary region.

For example, the drain extension region may be suitable for blocking a drain-to-source voltage in a range of from 5 V to 200 V. This may, for instance, be adjusted by means of the dopant profile and/or the lateral dimensions of the drain extension region.

For example, the FET may have a deep body region of the second conductivity type, which is electrically connected to the auxiliary region and extends laterally below the drain extension region. An extent of the deep body region in the first lateral direction and an extent of the drain extension region in the first lateral direction may at least partially overlap.

For example, the shielding dielectric may be a shallow trench isolation structure or a LOCOS structure.

For example, a thickness of the shielding dielectric may exceed a thickness of the gate dielectric by from 100% to 600%.

An integrated circuit, according to one exemplary embodiment of this disclosure, has the FET according to one of the examples described herein.

For example, the auxiliary region of the FET in the integrated circuit may be electrically connected to a GND (ground) pin.

For example, the FET in the integrated circuit may be interconnected as a high-side switch in order to provide a supply voltage for a logic circuit unit.

Details relating to the structural layout, the function or the technical advantages of the features described above apply similarly for the method described below and the examples illustrated by the drawings, and vice versa. The examples and features described above and below may be combined.

A method for forming an FET according to one exemplary embodiment comprises, for example, forming a dielectric structure which has a gate dielectric and a shielding dielectric. The shielding dielectric may be thicker than the gate dielectric and adjoin or be spaced apart from the gate dielectric along a first lateral direction. For example, the method additionally comprises forming a channel region of a first conductivity type, which adjoins a lower side of the gate dielectric. The method additionally includes, for example, forming an auxiliary region of a second conductivity type, which adjoins the lower side of the gate dielectric and adjoins the channel region along a second lateral direction. The method may also include forming a drain extension region of the first conductivity type, which adjoins a lower side of the shielding dielectric.

Functional and structural details which have been described in relation to the examples above also apply for the examples represented in the figures and described further below. In the examples represented, the first conductivity type is an n-type and the second conductivity type is a p-type for an n-channel FET. The conductivity types may also be reversed, so that for a p-channel FET the first conductivity type may be a p-type and the second conductivity type may be an n-type.

Figure 1B:
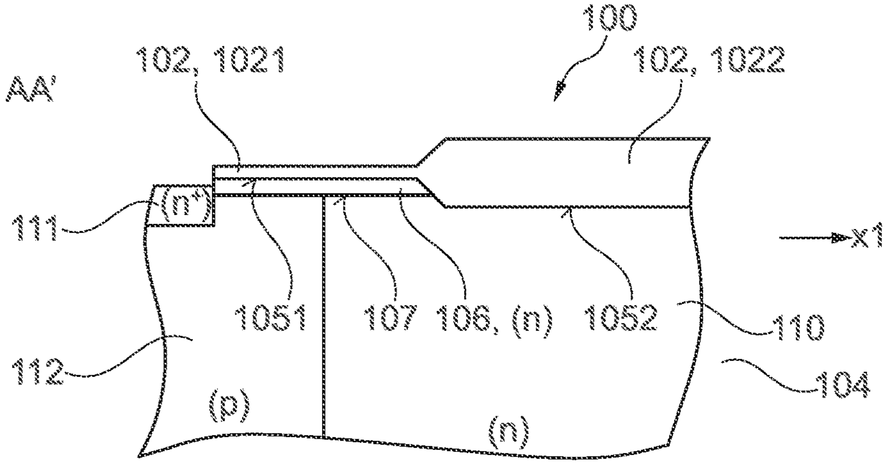
Figure 1C:
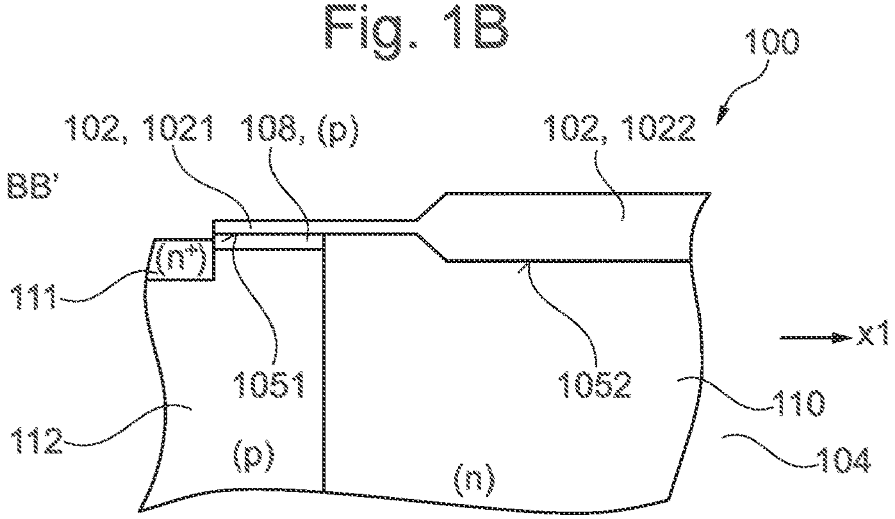

The schematic plan view of FIG. 1A and the associated exemplary cross-sectional views of FIG. 1B, 1C represent an exemplary FET 100. The FET is of the depletion type, i.e. self-conducting. The cross-sectional view of FIG. 1B is taken along the section line AA' of FIG. 1A, and the cross-sectional view of FIG. 1C is taken along the section line BB' of FIG. 1A.

The FET 100 has a dielectric structure 102 on a semiconductor body 104. The dielectric structure has a gate dielectric 1021 and a shielding dielectric 1022. The shielding dielectric 1022 is thicker than the gate dielectric 1021 and adjoins the gate dielectric 1021 along a first lateral direction x1. A thickness, i.e. vertical dimension, of the shielding dielectric 1022 may for example exceed a thickness of the gate dielectric 1021 by from 100% to 600%. In the example represented, the shielding dielectric 1022 is configured as a LOCOS structure. As an alternative, however, the shielding dielectric 1022 may also be configured as an STI dielectric or planar dielectric.

The FET 100 of the depletion type additionally has an n-doped channel region 106, which adjoins a lower side 1051 of the gate dielectric 1021. The n-doped channel region 106 merges into an $n^+$-doped source region 111. The FET 100 also has a p-doped auxiliary region 108, which adjoins the lower side 1051 of the gate dielectric 1021 and adjoins the channel region 106 along a second lateral direction x2. The channel region 106 and the auxiliary region 108 respectively extend in the form of a strip along the first lateral direction x1. A strip width w1 of the channel region 106 along the second lateral direction x2 may, for example, be from two to twenty times as great as a strip width w2 of the auxiliary region 108 along the second lateral direction x2. A strip length 11 of the channel region 106 along the first lateral direction x1 may, for example, be greater than a strip length 12 of the auxiliary region 108 along the first lateral direction x1.

The FET 100 also comprises an n-doped drain extension region 110, which adjoins a lower side 1052 of the shielding dielectric 1022 and a lower side 107 of the channel region 106. The drain extension region 110 laterally adjoins a p-doped body region (bulk region) 112.

Figure 1D:
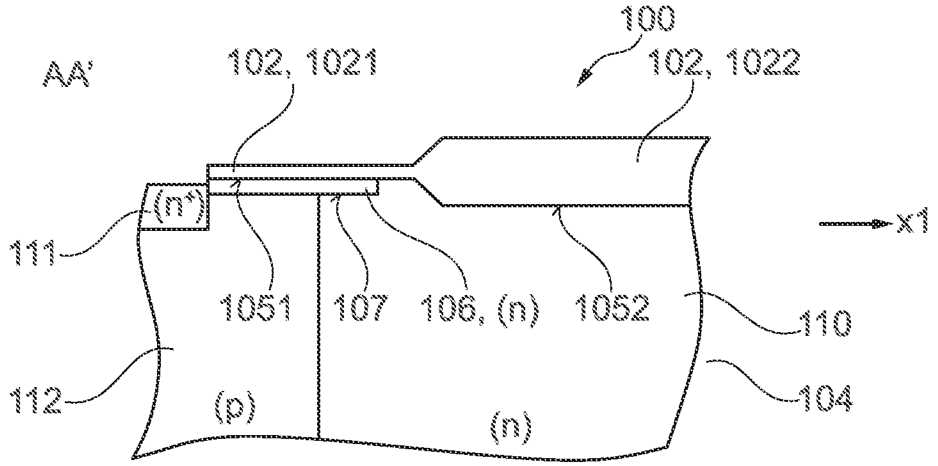
FIG. 1D shows another exemplary field-effect transistor of the depletion type in a cross-sectional view.

In the cross-sectional view shown in FIG. 1A, the channel region 106 extends along the first lateral direction x1 from the source region 111 to the shielding dielectric 1022. As an alternative, the channel region 106 may also end before the shielding dielectric 1022, as is represented by way of example in FIG. 1D.

Figure 2A:
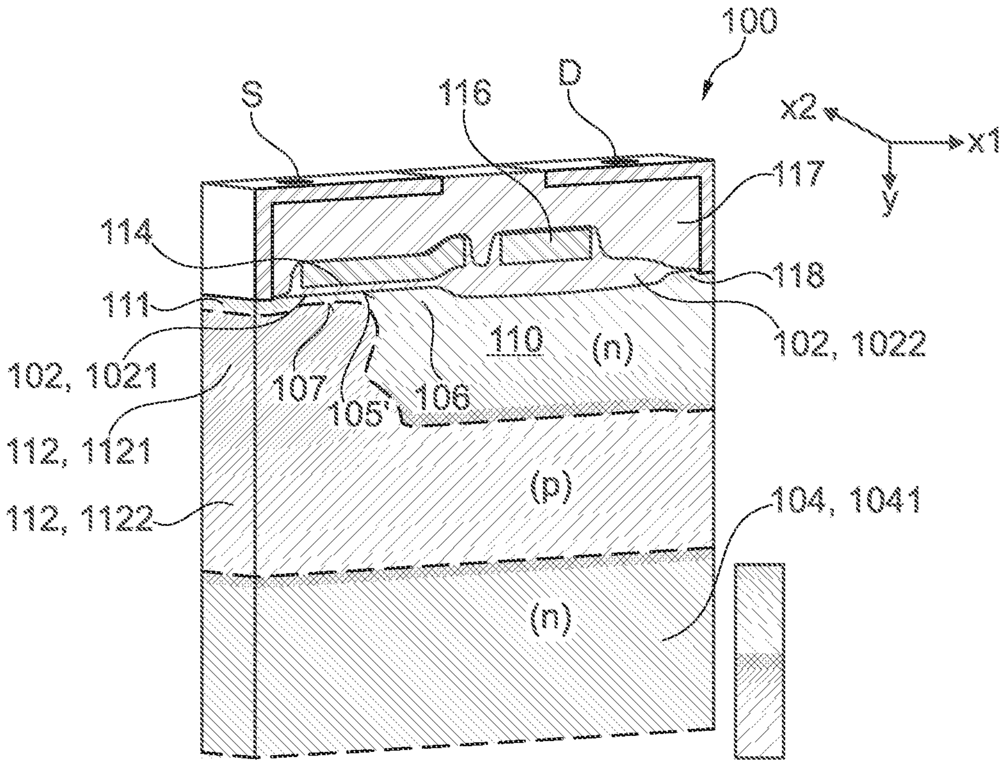
FIGS. 2A and 2B are exemplary perspective views of a field-effect transistor of the depletion type.
Figure 2B:
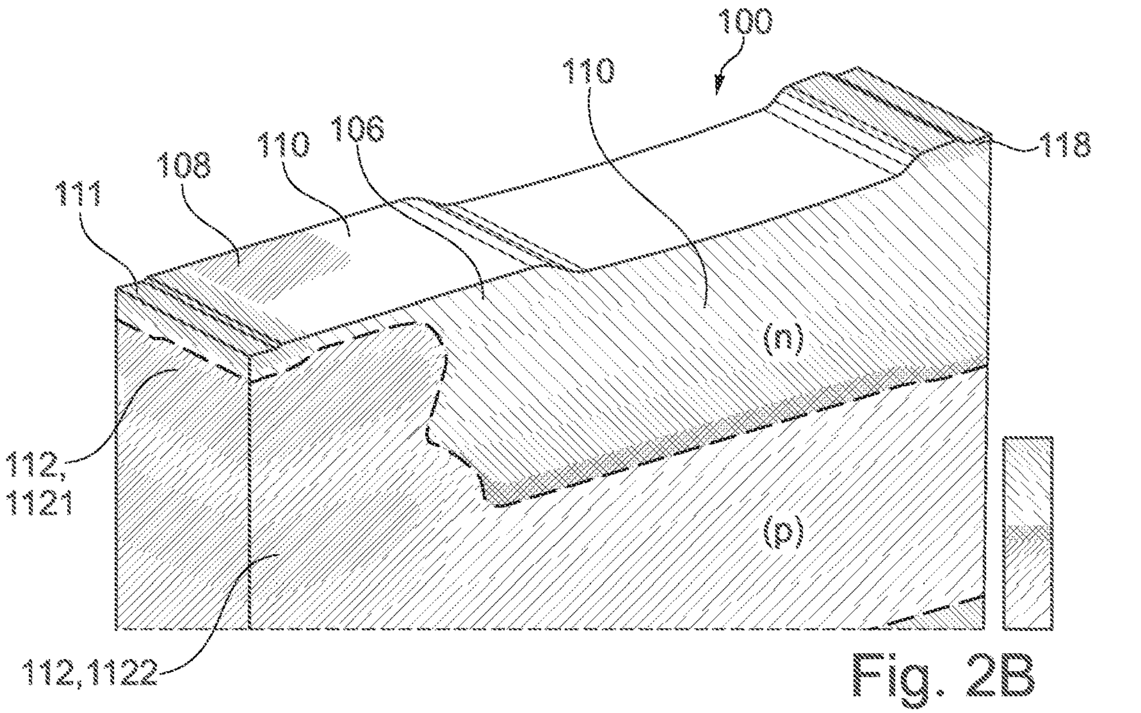

Further exemplary features of an FET 100 are represented in the perspective views of FIGS. 2A and 2B. In this case, FIG. 2B is based on FIG. 2A without representing the interconnection area with dielectric and conducting structures above the semiconductor body.

The channel region 106 adjoins the lower side 1051 of the gate dielectric 1021. A gate electrode 114 is formed on the gate dielectric 1021 and extends as far as the shielding dielectric 1022. Formed on the shielding dielectric 1022, there is a field electrode 116 which is spaced apart laterally from the gate electrode 114 and, like the gate electrode 114, adjoins an interlayer dielectric 117. A source electrode S comprises a part of a metallization level of the interconnection area as well as a contact plug or a contact line, which extends through the interlayer dielectric 117 to the $n^+$-source region 111. A drain electrode D comprises another part of the metallization level of the interconnection area as well as a further contact plug or a further contact line, which extends through the interlayer dielectric 117 to an $n^+$-drain region 118.

The p-doped body region 112 is subdivided into a shallow body region 1121 and a deep body region 1122. The shallow body region 1121 adjoins the lower side 107 of the channel region 106 and may comprise the auxiliary region 108. The deep body region 1122 overlaps in the vertical direction y with the shallow body region 1121 and extends laterally to below the drain extension region 110. Below the deep body region 1122, an n-doped semiconductor substrate 1041 is formed.

Figure 3A:
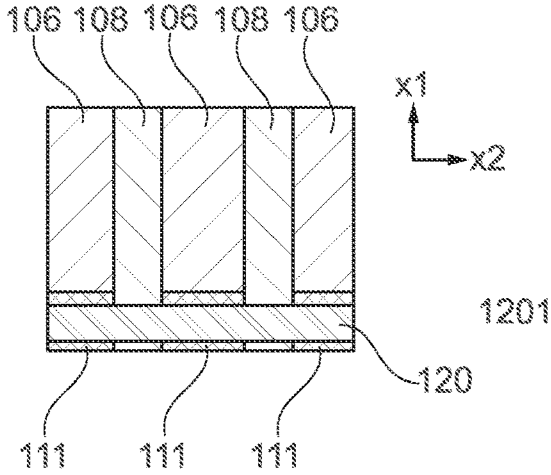
FIGS. 3A to 3C show exemplary contact arrangements on the body and source of an FET of the depletion type.

In the schematic plan view of FIG. 3A, the channel region 106 and the auxiliary region 108 are electrically connected in common by a contact 120 extending along the second lateral direction x2.

Figure 3B:
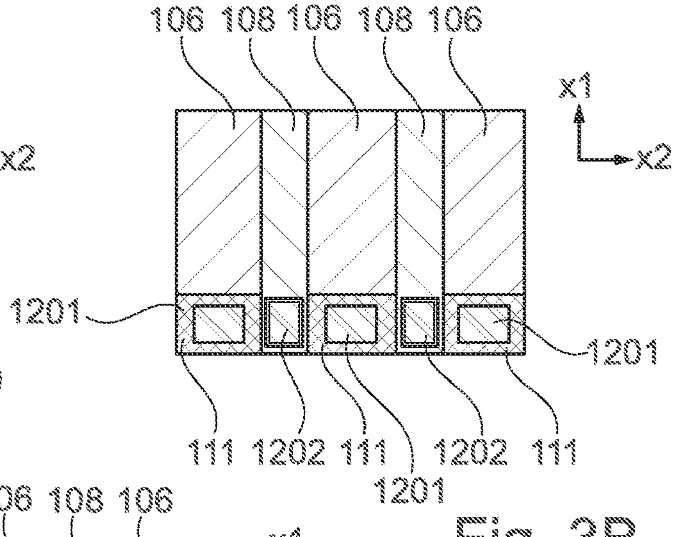

In the schematic plan view of FIG. 3B, the channel region 106 and the auxiliary region 108 are electrically connected by contacts 1201, 1202 arranged mutually offset along the second lateral direction x2.

Figure 3C:
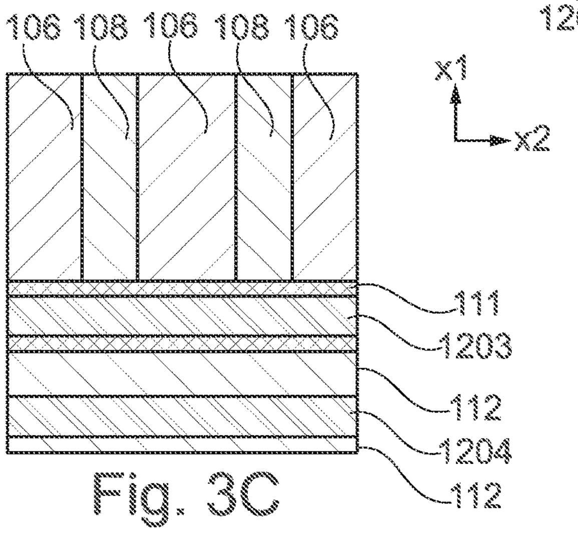

In the schematic plan view of FIG. 3C, the channel region 106 and the auxiliary region 108 are electrically connected by contacts 1203, 1204 arranged mutually offset along the first lateral direction x1.

Exemplary interconnections and electrode configurations of the FET 100 inside an integrated circuit 200 will be described below with reference to FIGS. 4A and 4B.

Figure 4A:
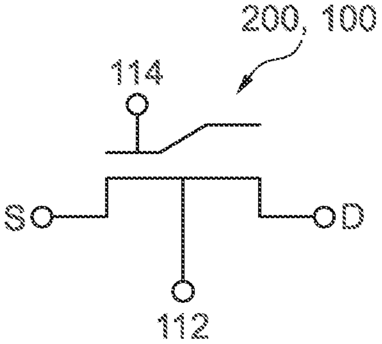
FIGS. 4A, 4B and 5 show exemplary circuit arrangements of an FET of the depletion type.
Figure 4B:
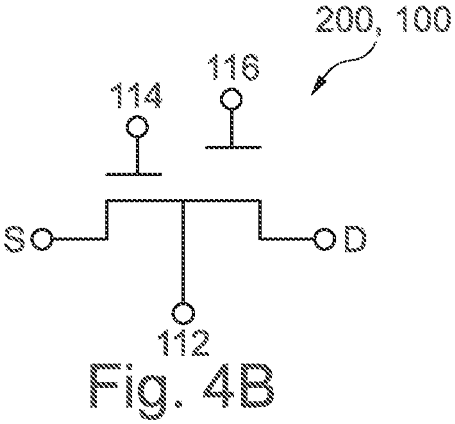

The FET 100 inside the integrated circuit 200 may, as shown in FIG. 4A, have the gate electrode 114 but no further field electrode. As is represented in FIG. 4B, the FET 100 in the integrated circuit 200 may also have a field electrode 116, which may for example be formed on the shielding dielectric, besides the gate electrode 114.

The gate electrode 114 may be supplied with a gate voltage VG via agate drive circuit, for example with VG in the range of 2.5 V. The source electrode S may, for example, form the output of a high-side switch and deliver an output voltage of 3 V. The drain electrode D may, for example, be connected to a supply voltage or to a microcontroller and, for example, have a potential of 3 V, 5 V or 40 V. The body region (bulk) 112 may, for example, be electrically connected to GND in order for instance to achieve capacitive decoupling of background noise.

Figure 5:
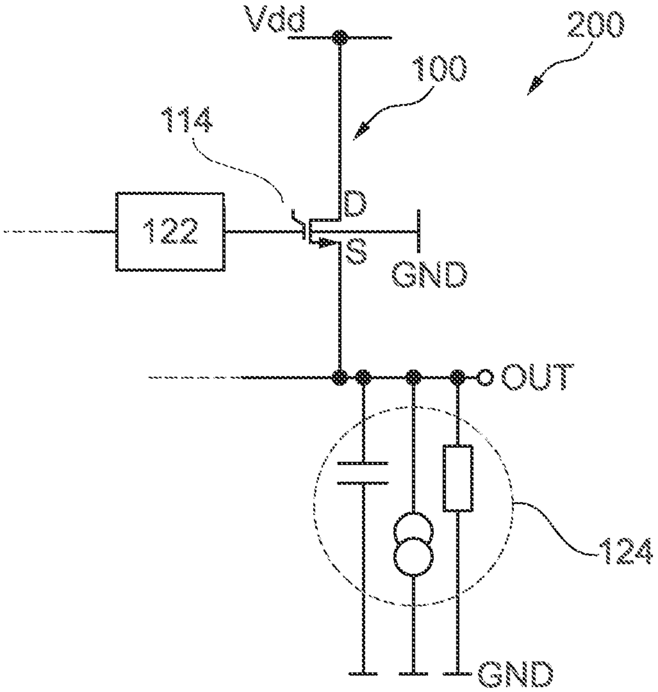

A circuit part of an exemplary integrated circuit 200, which comprises the FET 100, is represented in FIG. 5. The drain electrode D of the FET 100 is connected to a supply voltage Vdd. The gate electrode is connected to a gate drive circuit 122. The body region (bulk) 112 of the FET is connected to GND and the source electrode is connected to the output terminal OUT, to which a load 124 represented by way of example is connected.

The aspects and features which have been mentioned and described together with one or more of the examples and figures described above may also be combined with one or more of the other examples in order to replace a similar feature of the other example or to introduce the feature additionally into the other example.

Although specific embodiments are represented and described herein, a person skilled in the art will understand that the specific embodiments shown and described may be replaced with very many alternative and/or equivalent embodiments without thereby departing from the scope of application of the present invention. The present application is intended to cover all adaptations or variations of the specific embodiments described herein. This invention is restricted only by the claims and their equivalents.

What is claimed is:

1. A field-effect transistor (FET), comprising:

a dielectric structure having a gate dielectric and a shielding dielectric, the shielding dielectric being thicker than the gate dielectric and adjoining or being spaced apart from the gate dielectric along a first lateral direction;

a channel region of a first conductivity type adjoining a lower side of the gate dielectric; and an auxiliary region of a second conductivity type adjoining the lower side of the gate dielectric and adjoining the channel region along a second lateral direction.

2. The FET of claim 1, wherein the FET is a lateral depletion type FET.

3. The FET of claim 1, wherein the channel region and the auxiliary region are arranged alternating along the second lateral direction.

4. The FET of claim 1, wherein the auxiliary region is a part of a well region of the second conductivity type, which adjoins a lower side of a part of the channel region.

5. The FET of claim 4, wherein the well region has a first vertical profile of dopants of the second conductivity type, and a maximum dopant concentration of the first vertical profile lies in a range of from $10^{17}$ $cm^{-3}$ to $5\times10^{17}$ $cm^{-}$.

6. The FET of claim 5, wherein the channel region has a second vertical profile of dopants of the first conductivity type, and a maximum dopant concentration of the second vertical profile lies in a range of from $10^{17}$ $cm^{-3}$ to $3\times10^{18}$ $cm^{-}$.

7. The FET of claim 6, wherein the dopants of the first vertical profile in the channel region partially compensate for the dopants of the second vertical profile in the channel region.

8. The FET of claim 1, wherein the first channel region and the auxiliary region respectively extend in a form of a strip along the first lateral direction.

9. The FET of claim 8, wherein a strip width of the channel region along the second lateral direction ranges from two to twenty times as great as a strip width of the auxiliary region along the second lateral direction.

10. The FET of claim 8, wherein a strip length of the channel region along the first lateral direction is greater than a strip length of the auxiliary region along the first lateral direction.

11. The FET of claim 1, wherein the channel region and the auxiliary region are electrically connected by contacts arranged mutually offset along the first lateral direction or along the second lateral direction.

12. The FET of claim 1, wherein the channel region and the auxiliary region are electrically connected in common by a contact extending along the second lateral direction.

13. The FET of claim 1, further comprising:

a drain extension region of the first conductivity type adjoining a lower side of the shielding dielectric.

14. The FET of claim 13, wherein a part of the drain extension region adjoins a lower side of a part of the channel region.

15. The FET of claim 13, wherein the drain extension region is suitable for blocking a drain-to-source voltage in a range of from 5 V to 200 V.

16. The FET of claim 13, further comprising:

a deep body region of the second conductivity type electrically connected to the auxiliary region and laterally extending below the drain extension region, wherein an extent of the deep body region in the first lateral direction and an extent of the drain extension region in the first lateral direction at least partially overlap.

17. The FET of claim 1, wherein the shielding dielectric is a shallow trench isolation structure or a LOCOS (local oxidation of silicon) structure.

18. The FET of claim 1, wherein a thickness of the shielding dielectric exceeds a thickness of the gate dielectric by from 100% to 600%.

19. An integrated circuit comprising the FET of claim 1.

20. The integrated circuit of claim 19, wherein the auxiliary region is electrically connected to a ground pin.

21. The integrated circuit of claim 19, wherein the FET is interconnected as a high-side switch to provide a supply voltage for a logic circuit unit.

22. A method for forming a field-effect transistor (FET), the method comprising:

forming a dielectric structure having a gate dielectric and a shielding dielectric, the shielding dielectric being thicker than the gate dielectric and adjoining or being spaced apart from the gate dielectric along a first lateral direction;

forming a channel region of a first conductivity type, which adjoins a lower side of the gate dielectric; and forming an auxiliary region of a second conductivity type, which adjoins the lower side of the gate dielectric and adjoins the channel region along a second lateral direction.

23. The method of claim 22, further comprising:

forming a drain extension region of the first conductivity type, which adjoins a lower side of the shielding dielectric.

* * * * *